United States Patent [19]

Kitamura et al.

[11] Patent Number: 5,191,202
[45] Date of Patent: Mar. 2, 1993

[54] PHOTOELECTRIC CONVERSION DEVICE

[75] Inventors: Koichi Kitamura; Atsushi Kawasaki; Hidenori Mimura; Yasumitsu Ohta; Takashi Sawafuji, all of Tokyo, Japan

[73] Assignee: Nippon Steel Corporation, Tokyo, Japan

[21] Appl. No.: 668,638

[22] Filed: Mar. 13, 1991

[30] Foreign Application Priority Data

Mar. 14, 1990 [JP] Japan .................. 2-64925

[51] Int. Cl.$^5$ .......................................... H01L 27/146
[52] U.S. Cl. .......................... 250/208.1; 358/213.11; 358/213.29
[58] Field of Search ................ 250/208.1; 358/213.29, 358/213.11

[56] References Cited

U.S. PATENT DOCUMENTS

| | | | |
|---|---|---|---|
| 4,369,372 | 1/1983 | Yoshioka et al. | 358/213.15 |
| 4,499,384 | 2/1985 | Segawa et al. | 358/213.11 |
| 4,604,527 | 8/1986 | Chenevas-Paule et al. | 358/448 |

FOREIGN PATENT DOCUMENTS

| | | |
|---|---|---|
| 0112202 | 6/1984 | European Pat. Off. |
| 60-147158 | 8/1985 | Japan |
| 61-007242 | 3/1986 | Japan |
| 61-242068 | 10/1986 | Japan |

OTHER PUBLICATIONS

Electronics & Communications in Japan/Part II: Electronics, "Two Dimensional Photosensor Using a-Si Pin Diodes", K. Senda et al., Oct. 1987, vol. 70, No. 10, pp. 9-15.

Japanese Journal of Applied Physics, Supplements, Extended Abstracts of the 15th Conference on Solid State Devices and Materials, "High Speed Contact Type Linear Sensor Array Using a-Si Pin Diodes", H. Yamamoto et al., 1983, pp. 205-208.

Primary Examiner—Constantine Hannaher
Attorney, Agent, or Firm—Steven M. Rabin

[57] ABSTRACT

A photoelectric transducer device including a plurality of sensor elements made up of photodiodes and blocking diodes on a substrate, connected into a linear pattern which extends in a primary scanning direction, the sensor elements to be driven in a suitable sequence to read image data from an original document. Each sensor element include a first lower electrode formed on the substrate, a second lower electrode, formed on the substrate and electrically separated from the first electrode, a photodiode formed on the first electrode, a blocking diode formed on the second electrode for preventing crosstalk, and an upper electrode formed on the photodiode and blocking diode for electrically connecting them. Lead wires for connecting the sensor elements to output circuits extend in the primary scanning direction on the first lower electrodes with an insulating film in between, the first lower electrodes being selectively connected to the lead wires through holes provided in the insulating film.

36 Claims, 4 Drawing Sheets

PHOTOELECTRIC CONVERSION DEVICE

CROSS REFERENCE TO RELATED APPLICATION

The present disclosure relates to the subject matter disclosed in Japanese Application No. 64925/90 of Mar. 14, 1990, the entire specification of which is incorporated herein by reference.

BACKGROUND OF THE INVENTION

1. Field of the Invention

The present invention relates to a photoelectric conversion device (transducer) such as an image sensor used, for example, as an image reading means in hand-held scanners and facsimile machines.

2. Description of the Prior Art

Image sensors come in various types. The most typical prior art image sensor is one in which numerous pairs of photodiodes and blocking diodes arranged linearly in a primary scanning direction are divided into as many blocks as the number of input circuit channels, the blocks being connected into a linear pattern.

The above prior art image sensor works as follows. The photodiodes accumulate electrical charges upon receipt of the light reflect from an original document. When one input circuit supplies a pulse to the blocking diodes in the corresponding block, these diodes are turned on, causing the charges in the photodiodes of the same block to flow into the output circuits through as many lead wires as there are output circuit channels. Each input circuit supplies a pulse to the corresponding block in turn for the sequential scanning of the blocks, thereby to read image data of one line.

Each paired photodiode and blocking diode is formed on a glass substrate of amorphous silicon ($\alpha$-Si) or like semiconductor material in a so-called pin junction containing successive "p", "i" and "n" layers from the bottom up, a shared lower electrode or contact connecting the anodes of both diodes. The top surface of the semiconductor layers of the photodiode has a transparent conductive film that allows the reflected light from the document to pass through. The entire diode assembly would, of course, be covered with an insulation film with the exception of part of the transparent conductive film or layer and of the lead wire for electrical connection of the diodes to each other. Respective upper electrodes or contacts are formed on top of the paired photodiode and blocking diode, and connect the photodiode to a lead wire and the blocking diode to the input circuit. A protective film is provided as needed over the diode assembly.

U.S. Pat. No. 4,369,372 discloses an image sensor having photodiodes and blocking diodes formed on the common lower electrodes, as outlined above. In crystalline silicon integrated circuits used for image sensor applications, the use of aluminum (Al) for electrodes and lead wires is generally preferred because of its relatively low electrical resistivity. Aluminum can, however, have a number of disadvantages. One disadvantage of aluminum is its weak adhesiveness to the glass substrate. For example, the adhesiveness of aluminum to the glass substrate is only one seventh that of chromium (Cr).

Furthermore, the lower electrodes of blocking diodes and photodiodes must be made of a thermally stable metal that will not mix with the semiconductor at temperatures as high as 250° C. during production of the semiconductor layers. At such high temperatures, aluminum tends to diffuse into the semiconductor.

The lower electrodes are required to make an ohmic junction with the semiconductor layer formed immediately thereabove. In this sense, too, aluminum is not a preferred substance for forming the lower electrodes.

With the above-described properties taken into account, the lower electrodes of blocking diodes and photodiodes are usually made of such metals as chromium (Cr), molybdenum (Mo), tantalum (Ta) and MoTa, which have high melting points, high adhesiveness and thermal stability.

Since lead wires are directly formed on the glass substrate, they may be produced during the same process as the lower electrodes. Thus, the lead wires may be made of the same metal as the lower electrode, such as chromium, the selection being made in consideration of the metal's adhesiveness to the glass substrate and the efficiency of its use in the production process. On the other hand, the upper electrode, not facing the same constraints as the lower electrodes and lead wires, may advantageously be formed of aluminum. In this manner, lower electrodes and lead wires of the prior art diode assembly are formed from chromium or other metals of high melting point, while the upper electrode thereof are formed from aluminum.

Whereas the use of high-melting-point metals for the lower electrodes and the lead wires has advantages as described above, these metals have a disadvantage of a higher electrical resistivity than that of aluminum. For example, while the electrical resistivity of aluminum is $2.5 \times 10^{-8}$ $\Omega$m at 0° C. and $3.55 \times 10^{-8}$ $\Omega$m at 100° C., the electrical resistance of chromium (resistance for a volume of unit area and unit length) is $12.7 \times 10^{-8}$ $\Omega$m at 0° C. and $16.1 \times 10^{-8}$ $\Omega$m at 100° C. If the wiring of an image sensor is formed from a metal of such high resistivity, the time constant of the wiring becomes greater. This results in a reduced response time of the image sensor, which will have its effect in the form of a lower reading speed. Because the peak value of the image signal drops with higher resistance, the sensitivity of the image sensor is lowered and its S/N ratio worsens correspondingly.

In particular, the lead wires play a large part in increasing the electrical resistance of the linear connection as a whole. This is because the lead wires for the primary scanning direction are very long. For example, while the lower electrodes for the secondary scanning direction are 1 mm long at most, the lead wires for the primary scanning direction are as long as 108 mm for an A6-size image sensor and 216 mm for an A4-size image sensor.

One way to reduce the electrical resistance of the lead wires is to increase their width. However, increasing the width of the lead wires proportionately widens the area of the crossover formed between the lead wires and the upper electrodes. A large crossover capacity of the crossing wires and electrodes promotes crosstalk between them. The correspondingly lowered MTF (modulation transfer function) deteriorates the image quality obtained. Thus, there is a limit to widening the lead wires for the purpose of reducing their electrical resistance.

Another way to lower the electrical resistance of the lead wires is to increase their thickness. Chromium wires are typically made thousands of angstroms thick by evaporation. However, if attempts were made to increase their thickness, the stress that would develop therein during growth would make it impossible to form a stable thin film thereof.

Even if a thicker chromium film were somehow obtained, the lower electrodes would be correspondingly thickened since they are formed during the same deposition step in which the lead wires are formed. This would add to the total thickness of the diode assembly when combined with the semiconductor layers. As a result, the insulation film formed over these components would tend to have pronounced curvature near the periphery of the photodiodes and blocking diodes, and cracks would likely appear there.

SUMMARY OF THE INVENTION

It is therefore an object of the present invention to provide a photoelectric transducer device, such as an image sensor, in which the lower electrode arrangement is made of a thermally stable substance with high adhesiveness to a glass substrate, and the wiring as a whole has reduced electrical resistance, thereby to overcome the above and other deficiencies and disadvantages of the prior art.

In achieving the foregoing and other objects of the present invention and according to a first aspect thereof, there is provided a photoelectric transducer device comprising an insulating substrate, a first electrode or contact and a second electrode or contact mounted on the substrate, the second electrode being electrically separated from the first electrode, a photoelectric conversion means for converting optical radiation impinging thereon to electrical energy, the photoelectric conversion means being formed on the first electrode, a switching means formed on the second electrode for preventing crosstalk, and a third electrode, formed on the switching means and the photoelectric conversion means, for connecting the two means. The photoelectric conversion means are preferably photodiodes but could also be, for example, charge-coupled devices or phototransistors, and the switching means are preferably blocking diodes.

In an arrangement which includes a linear array of photoelectric conversion means in a common block on the substrate, the first electrodes (on which the photoelectric conversion means are formed) are connected to lead wires (connection lines) for a primary scanning direction. The second electrodes, on which the respective switching means are mounted, form a single electrode which is common to, and therefore connects, all of the switching means of the array of photoelectric conversion means. The switching means is therefore provided for crosstalk prevention. Since the third electrodes which electrically connect the switching means and the photoelectric conversion means are formed thereon, the static electricity that may be carried by the substrate and other parts is readily removed through the electrode arrangement up until the last stage of production.

According to a second aspect of the invention, there is provided a photoelectric transducer device comprising a plurality of sensor elements arranged linearly, each of the sensor elements being made up of a photodiode and a blocking diode connected via the anodes of the two diodes (back-to-back connection) or via the cathodes thereof (front-to-front connection), the sensor elements being driven in a suitable sequence to read image data from an original document, wherein each photodiode is formed on a first lower electrode or contact mounted on a substrate, each blocking diode is formed on a second lower electrode or contact which is mounted on the same substrate and is electrically separated from the first lower electrode, and an upper electrode connects the anodes or cathodes of each pair of photodiode and blocking diode.

According to a third aspect of the invention, there is provided a photoelectric transducer device as defined according to the second aspect of the invention, wherein the lower electrodes are formed in common with lead wires (first connection lines) for a secondary scanning direction. Lead wires for the primary scanning direction are formed on (cross) the lower electrodes of the photodiodes with an insulation layer therebetween. In order to connect the sensor elements linearly, these lead wires for the primary scanning direction are formed concurrently with formation of the upper electrodes and are selectively connected to the lower electrodes they cross through holes formed in the insulation layer.

Thus, by forming the anode-to-anode (back-to-back) or cathode-to-cathode (front-to-front) connection of the two diodes through the upper electrode, the lower electrodes for the photodiodes are free to provide the connection to the lead wires for the primary scanning direction.

The lower electrodes are made of chromium, or similar metal of a high melting point, to provide for adequate adhesiveness to the substrate and stability at high temperatures. On the other hand, with the lead wires for the primary scanning direction connected as needed to the lower electrodes through contact holes provided in the insulation layer, the lead wires for the primary scanning direction are in effect formed on the substrate without direct contact therewith, so that they are not subject to the requirements of adhesiveness to the substrate. Moreover, since the upper electrodes, and the lead wires for the primary direction which are provided for linear connection, are not in direct contact with the substrate, they are not subject to the requirement of stability at the high temperatures at which the semiconductor layers are produced. Not being subject to a requirement of adhesiveness to the substrate and not being subject to a requirement of stability at high temperatures, the upper electrodes and the lead wires for the primary scanning direction may be made, for example, of aluminum or other metal of relatively low electrical resistance. As a result, the wiring as a whole has low electrical resistance.

BRIEF DESCRIPTION OF THE DRAWINGS

These and other features and advantages of the invention may be more completely understood from the following detailed description of the preferred embodiment with reference to the accompanying drawings in which.

DESCRIPTION OF THE PREFERRED EMBODIMENT

Figure 1:
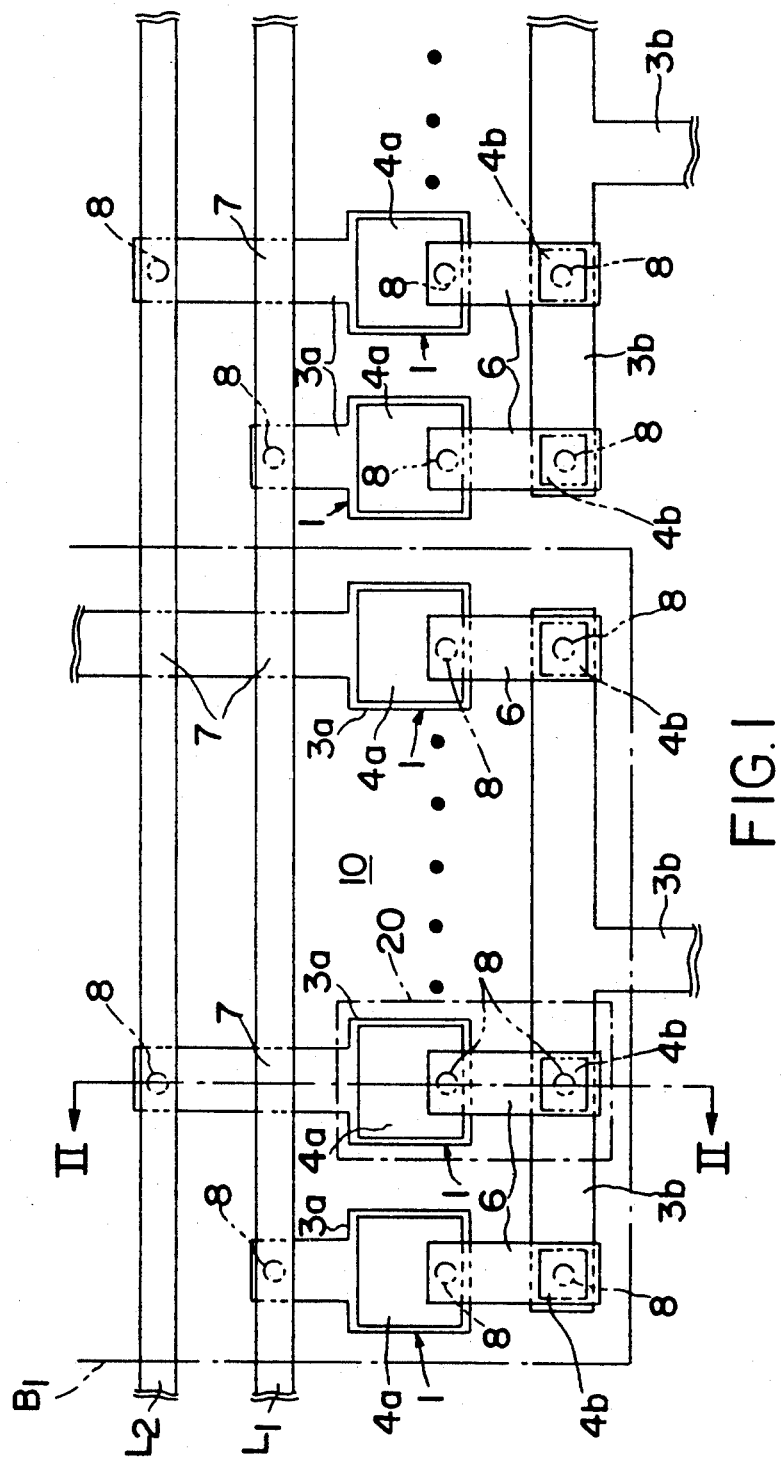
FIG. 1 is a partial plan view of an image sensor according to a preferred embodiment of the invention.
Figure 3:
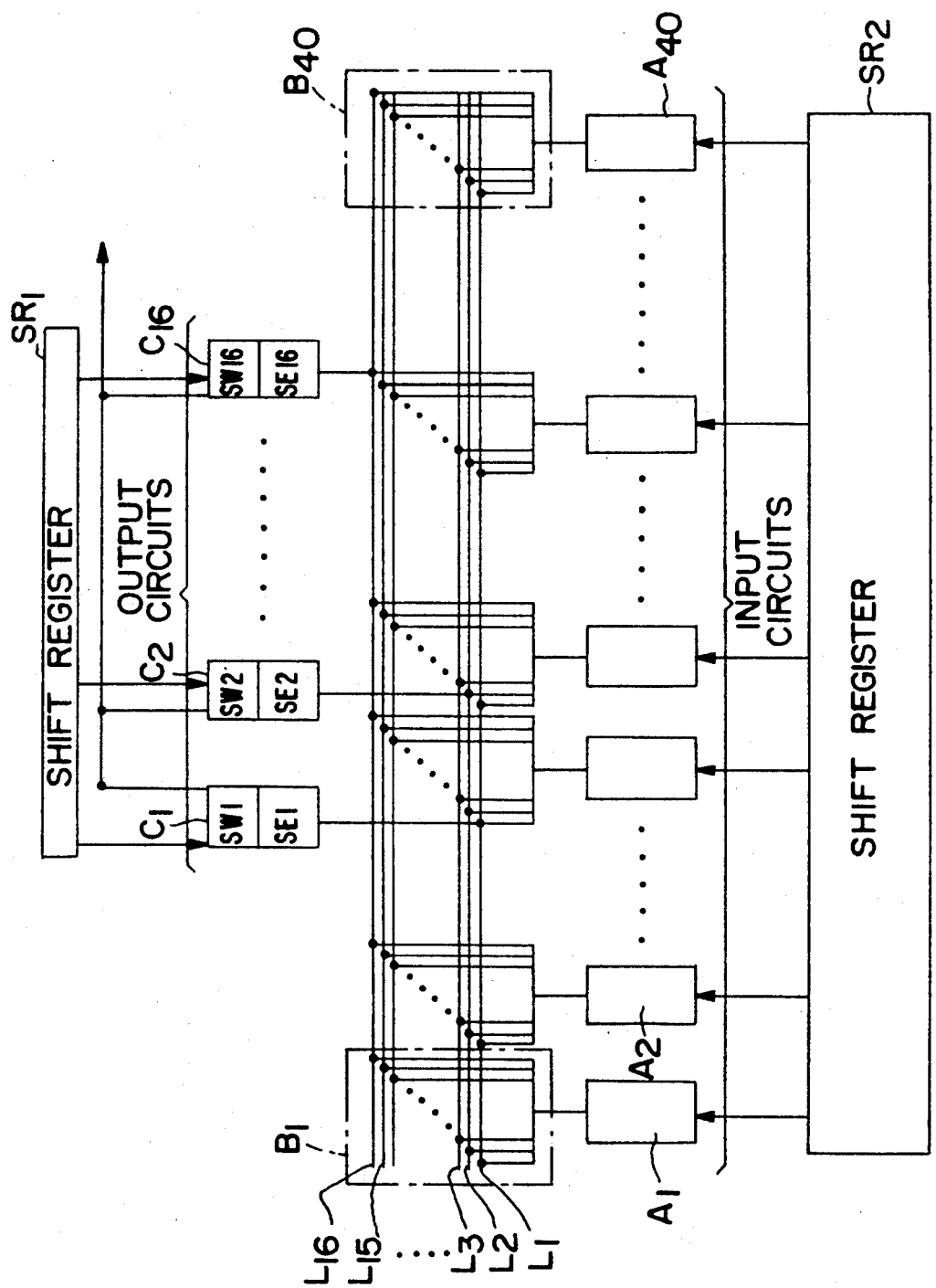
FIG. 3 is a circuit diagram of an image sensor according to the invention having a linear connection.

The preferred embodiment of the present invention will now be described with reference to the accompanying drawings. Referring first to FIGS. 1 and 3, the photoelectric transducer device or image sensor according to the invention includes n photoelectric transducer elements 1 (n=640 in the illustrated embodiment) arranged on a glass insulating substrate 10 in a linear array of a substantially constant pitch. The photoelectric transducer elements 1 are equally divided into N sensor blocks $B_1, \ldots, B_N$ (N=40 in the illustrated embodiment), each containing k photoelectric transducer elements (k=16 in the illustrated embodiment). Also provided in each sensor block are diode elements 2 respectively connected in series to corresponding ones of the photoelectric transducer elements 1 (thus, 640 diode elements are provided overall).

An output section consisting of k (16) output circuits $C_1, \ldots, C_{16}$ is provided. Each output circuit includes in series a switching element and a storage element as shown in FIG. 3. The storage element $SE_1, \ldots, SE_{16}$ are connected to the photoelectric transducer elements 1 of the same ordinal position among the 16 photoelectric transducer elements in each sensor block $B_1, \ldots, B_{40}$, via corresponding first electrodes or contacts $3a$ thereof.

The switching elements $SW_1, \ldots, SW_{16}$ are provided for transferring the signals stored in the storage elements. A first shift register SR1 is provided for controlling the switching elements $SW_1, \ldots, SW_{16}$. Forty (N) switching elements or input circuits $A_1, \ldots, A_{40}$ are respectively connected in series to the diode elements 2 of corresponding ones of the sensor blocks $B_1, \ldots, B_{40}$, via a common second electrode or contact $3b$ thereof. A second shift register SR2 is provided for controlling the 40 switching elements $A_1, \ldots, A_{40}$.

Figure 4:
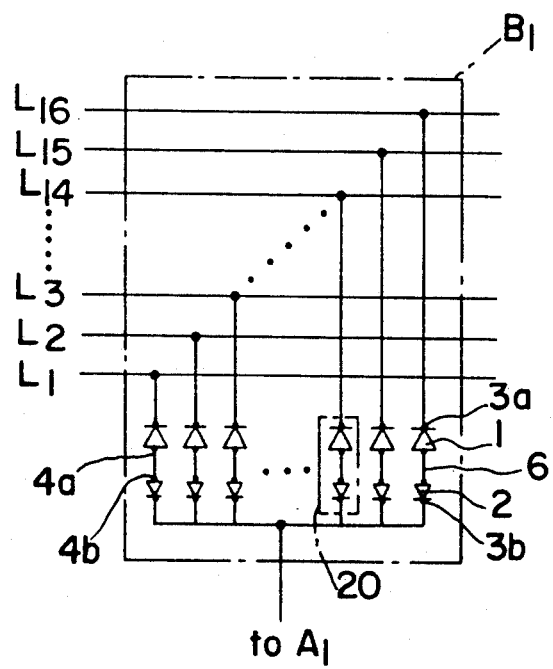
FIG. 4 is an enlarged detailed view of one of the block of sensor elements shown in FIG. 3.

How the sensor element blocks $B_1-B_{40}$ are connected to the output circuits $C_1-C_{16}$ and the input circuits $A_1-A_{40}$ will now be explained with reference to FIGS. 3 and 4. FIG. 4 depicts in detail one block $B_1$ included in FIG. 3. In the block $B_1$ of FIG. 4, 16 photoelectric transducer elements 1, in the form of photodiodes, are connected to 16 corresponding diode elements 2, in the form of blocking diodes, via connector strips 6 at their anode contacts $4a$, $4b$, i.e., back-to-back, to constitute 16 respective sensor elements 20. The connector strips 6 effectively operate as common upper electrodes for the respective photodiode-blocking diode pairs. The cathodes of the 16 photodiodes 1 are respectively connected via contacts or electrodes $3a$ to 16 corresponding lead wires (connection lines) $L_1-L_{16}$ which extend in the primary scanning direction and are connected to corresponding ones of the output circuits $C_1-C_{16}$. The photodiodes of the remaining blocks $B_2-B_{40}$ are similarly connected to the lead lines $L_1-L_{16}$. Thus, the sensor elements contained in the blocks $B_1-B_{40}$ are connected in a linear pattern. The cathodes of the 16 blocking diodes 2 of the block $B_1$ are connected via the common connection line and electrode $3b$ to the input circuit $A_1$. The blocking diodes of the remaining blocks $B_2-B_{40}$ are similarly connected to the input circuits $A_2-A_{40}$.

How the photoelectric transducer device or image sensor shown in FIG. 3 works will now be described. The photodiodes accumulate electric charges therein upon receipt of the light reflected from an original document. When the input circuit $A_1$ supplies negative pulses to the blocking diodes 2 via the common electrode $3b$, these diodes are turned on. This causes the electric charges in the 16 photodiodes 1 in the block $B_1$ to flow into the corresponding output circuits $C_1-C_{16}$ via the respective lead wires $L_1-L_{16}$. When the output circuits $A_2-A_{40}$ in turn supply negative pulses to the blocking diodes 2 in the blocks $B_2-B_{40}$, these blocking diodes 2 are consecutively turned on. (If the diodes 1 and 2 were connected front-to-front, that is cathode-to-cathode, then positive pulses would be supplied to the blocking diodes 2). This causes the electrical charges in the corresponding photodiodes 1 to flow into the output circuits $C_1-C_{16}$ in turn. Thus, image data of one line is read in by scanning the blocks $B_1-B_{40}$ in the manner described.

The detailed structure and preferred method of manufacture of the sensor elements 20 and the lead wires connected thereto will now be described with reference to FIGS. 1, 2 and 3.

Figure 2:
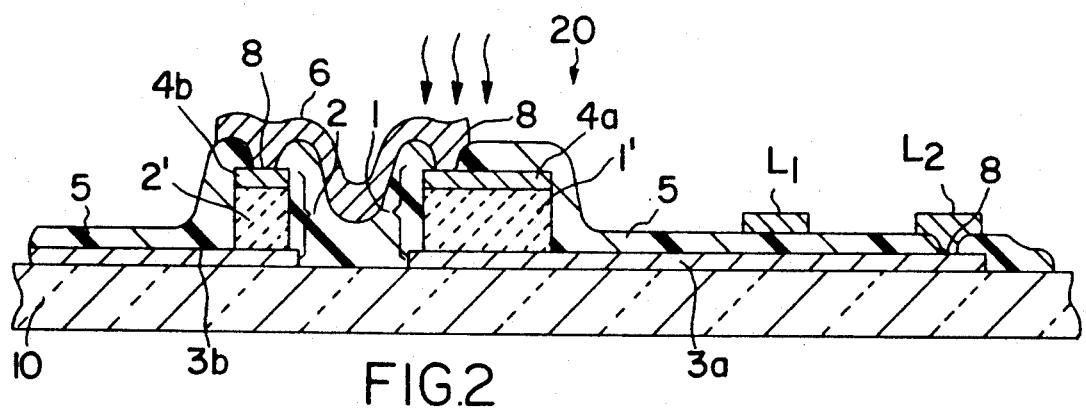
FIG. 2 is an enlarged sectional view of a sensor element taken on line II—II in FIG. 1.

FIG. 2 is an enlarged sectional view of a sensor element 20 taken in the direction of lines II—II in FIG. 1. Referring to FIG. 2, lower electrodes or contacts $3a$ and $3b$ are made of chromium or other metal having a high melting point and are formed on the glass insulating substrate 10 in the same manner as in the prior art. Therefore, the lower electrodes have sufficiently high adhesiveness to the glass substrate 10. What differs from the prior art is that there are two separate (first and second) lower electrodes $3a$ and $3b$ instead of one. The lower electrode $3a$, which is the first electrode, is a conductor extending in the secondary scanning direction that connects the cathodes of the photodiodes to the lead wires for the primary scanning direction. The lower electrode $3b$, which is the second electrode and is common to all of the sensor elements of a given block, is a conductor that connects the cathode of the blocking diode to the input circuit.

Referring to FIG. 2, the semiconductor layers $1'$, which constitute the photoelectric conversion means of the photodiode 1, are provided on the lower electrode $3a$. The semiconductor layers $2'$ of the blocking diode 2, which constitute the switching means for prevention of crosstalk, are provided on the lower electrode $3b$. The semiconductor layers of both diodes 1 and 2, is made of α-Si semiconductor material or the like. Since the lower electrodes $3a$ and $3b$ are made of a high-melting-point metal, they remain stable even at temperatures as high as 250° C. during manufacture of the semiconductor. Thus, diffusion of the lower electrodes into the semiconductor layers is negligible, and the ohmic junction between electrode and semiconductor is maintained.

On top of the semiconductor layers $1'$ and $2'$ of the photodiode 1 and blocking diode 2, transparent conductor films made of ITO (indium tin oxide) or the like are respectively deposited to form the contacts $4a$ and $4b$. Then, an insulating film 5 is provided over the entire assembly except contact holes 8 on the transparent conductive films $4a$ and $4b$ and on the lower electrode $3a$.

Figure 5:
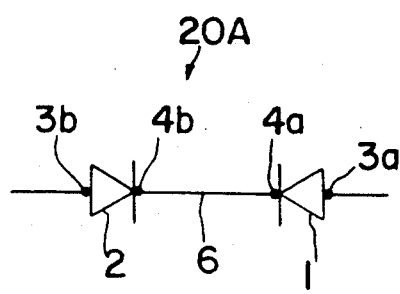
FIGS. 5 and 6 are schematic illustrations of sensor elements according to the invention with diodes having pin and nip junctions, respectively.
Figure 6:
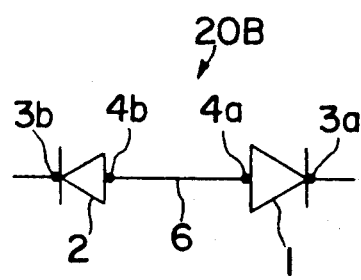

Furthermore, the upper (third) electrode 6 which is made of aluminum is then formed on the insulating film 5 so as to connect the photodiode 1 to the blocking diode 2. At this point, a back-to-back sensor element connection is provided if the semiconductor layers of the photodiode 1 and blocking diode 2 are connected in what is known as the "nip" junction ("n", "i" and "p" layers successively deposited on the lower electrode), or a front-to-front sensor element connection is provided if the semiconductor layers are connected so as to form a "pin" junction ("p", "i" and "n" layers successively deposited on the lower electrode). Image sensor elements 20A and 20B respectively with the pin (front-to-front) and nip (back-to-back) junctions are schematically illustrated in FIGS. 5 and 6.

The upper electrodes 6 and lead wires $L_1$-$L_{16}$ may both be readily overlaid with a protective film (passivation film) containing polyimide. This kind of protective film is stable and readily formed over staggered elements such as the electrodes 6 and lead wires $L_1$-$L_{16}$.

Since the transparent conductive films or contacts 4a and 4b are interposed between the aluminum upper electrode 6 and the semiconductor layers forming the photodiode 1, and blocking diode 2, this structure provides the ohmic junction. Because the upper electrode 6 is produced only after the semiconductor material has been manufactured at high temperatures, there is no problem in forming the electrode with aluminum, a substance that is unstable at high temperatures.

The lead wires $L_1$-$L_{16}$ are provided on the insulating film 5 in the same manufacturing stage as that in which the aluminum upper electrode 6 is provided. Thus, the lead wires may also be made of aluminum. This is made possible because there are provided two separate lower electrodes 3a and 3b, with the upper electrode 6 connecting the sensor elements in the back-to-back construction or the front-to-front construction.

The use of aluminum to produce the lead wires $L_1$-$L_{16}$ has several advantages. Since the lead wires $L_1$-$L_{16}$ for the primary scanning direction are far longer than the lower electrode 3a which extend in the secondary scanning direction, the electrical resistance of the wiring of the linear connections is drastically reduced. In turn, the response time of the photoelectric transducer device and the S/N ratio thereof are significantly improved. Moreover, since there is no need to increase the width of the lead wires $L_1$-$L_{16}$ to reduce their electrical resistance, the area and thus capacitance of crossover portions 7 formed between the lower electrodes 3a and the lead wires $L_1$-$L_{16}$ (see FIG. 1) is reduced. With the capacitance of the portions 7 held low, the quality of the images is spared deterioration due to crosstalk between the electrodes and the leads.

If there is not sufficient adhesiveness between the insulating film 5 and the upper electrodes 6 or between the film 5 and the lead wires $L_1$-$L_{16}$, the upper electrodes and the lead wires may be constructed in a two-layer structure of chromium and aluminum. That is, a thin coat or layer of chromium is deposited by evaporation on the insulating film 5, and is in turn overlaid with a coat or layer of aluminum to form the upper electrodes and lead wires. Since there exists enough adhesiveness between chromium and the insulating film 5 and between chromium and aluminum, the two-layer structure avoids the problem of relatively poor direct bonding between aluminum and the insulating film 5. Since the resistivity of aluminum is appreciably lower than that of chromium and other metals of high melting point, the resistance of the lead wires will be correspondingly lower even with the two-layer structure.

Moreover, the electrical resistance may be further reduced by making the lead wires thicker. This is possible with the structure according to the invention because among other reasons, the lead wires for the primary scanning direction $L_1$-$L_{16}$ may be formed directly on the insulating film 5 and connected to the lower electrodes 3a through holes 8 in the insulation film 5 and may be formed of aluminum (which is softer and develops less stress than high melting temperature conductors such as chromium).

On the other hand, chromium lead wires and lower electrodes in prior art image sensors cannot be made thick. Thick chromium lead wires and electrodes have high levels of stress. As a result, high stress would be created in the lead wires for the primary scanning direction and in the lower electrodes so that they cannot be made stable. Also, in the prior image sensors, conductive connections must be made between the upper electrodes (which are at a relatively high level), and lead wires for the primary scanning direction (which are formed directly on the glass substrate). As a result, the insulating material on which the contacts connecting the upper electrodes to the lead wires for the primary scanning direction are formed has high curvature and thickness and is therefore prone to form cracks.

In prior art image sensors, the lower electrode arrangement connects the photodiodes to the blocking diodes. As a result, once the photodiodes and blocking diodes are formed and overlaid with an insulating film, they cannot be inspected independently. By contrast, the image sensor of the preferred embodiment illustrated in FIGS. 1 and 2 allows the photodiodes 1 and blocking diodes 2, even after they are fully formed, to be inspected independently until covered by the protective film.

The image sensor depends significantly for its characteristics on those of the photodiodes and blocking diodes incorporated therein. The fact that these diodes are independently inspected after they are manufactured helps to improve the efficiency of evaluating the characteristics of image sensor and in performing process control during production.

Since each photodiode-blocking diode pair is connected back-to-back or front-to-front, static electricity (mostly positive) that may develop in the glass substrate invariably produces a reverse voltage in one of the diodes. If the reverse voltage exceeds the dielectric strength of the diode it develops in, that diode is destroyed. In prior art image sensors, the lower electrode arrangement that connects photodiodes to blocking diodes is completely covered with an insulating film in an early stage of production. This leaves the diodes vulnerable to destruction by the static electricity that may develop in the glass substrate during later stages of the manufacture.

By contrast, the image sensor of this embodiment has its upper electrodes connect the photodiodes to the blocking diodes, so the upper electrodes can remain exposed until the last stage of production. The lower electrodes 3a are connected to the lead wires for the primary scanning direction $L_1$-$L_{16}$ (at holes 8) and exposed at the output circuits $C_1$-$C_{16}$, and the lower electrodes 3b are exposed at the input circuits $A_1$-$A_{40}$. Thus, the reverse voltage that may be applied to the diodes is removed through the upper electrodes 6 and through the lower electrodes 3a and 3b. This setup dramatically reduces the incidence of diode destruction by static electricity. With fewer sensor elements susceptible to short-circuiting, the product yield improves.

It is to be understood that while the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A photoelectric transducer device, comprising:
   an insulating substrate;
   n sensor elements equally divided in N sensor blocks each containing k sensor elements, each sensor element including
   a first lower electrode mounted on said substrate,
   a second lower electrode mounted on said substrate, said second electrode being electrically separated from said first electrode, said first and second electrodes being formed of a material having a first resistivity,
   a photoelectric conversion means for converting optical radiation impinging thereon to electrical energy, said photoelectric conversion means being formed on said first electrode,
   a diode means, formed on said second electrode, for preventing crosstalk, and
   an upper electrode formed on said diode means and said photoelectric conversion means so as to electrically connected said diode means and said photoelectric conversion means;
   N first connection lines respectively corresponding to said N sensor blocks on a one-to-one basis, each first line being connected to all of the k second electrodes of the corresponding sensor block; and
   k second connection lines, the k sensor elements in each sensor block corresponding to said k second connection lines on a one-to-one basis, each second line being connected to the first electrodes of the sensor elements corresponding thereto, the second lines being formed of a material having a second resistivity which is lower than the first resistivity.

2. A photoelectric transducer device according to claim 1, wherein the upper electrodes are formed of the same material as forms the second connection lines.

3. A photoelectric transducer device according to claim 1, wherein said diode means comprises a blocking diode.

4. A photoelectric transducer device according to claim 3, wherein said blocking diode includes α-Si.

5. A photoelectric transducer device according to claim 1, wherein a melting point of the material of said second connection lines is lower than a melting point of the material of said first and second lower electrodes.

6. A photoelectric transducer device according to claim 1, wherein, in each sensor block, the second lower electrodes of said k sensor elements are formed by a single common electrode.

7. A photoelectric transducer device according to claim 1, wherein, for each sensor block, the second lower electrodes of said k sensor elements and the first connection line connected thereto are formed by a single common electrode.

8. A photoelectric transducer device according to claim 1, wherein, in each sensor element, said photoelectric conversion means is a photodiode and said diode means is a blocking diode connected with said photodiode anode-to-anode.

9. A photoelectric transducer device according to claim 1, wherein, in each sensor element, said photoelectric conversion means is a photodiode and said diode means is a blocking diode connected with said photodiode cathode-to-cathode.

10. A photoelectric transducer device according to claim 1, further comprising an insulation layer formed on said first and second lower electrodes.

11. A photoelectric transducer device according to claim 10, wherein said second connection lines are formed on said insulation layer and selectively connected to said first lower electrodes through holes formed in said insulation layer.

12. A photoelectric transducer device according to claim 1, wherein said photoelectric conversion means comprises a photodiode.

13. A photoelectric transducer device according to claim 1, wherein the second connection lines are longer than the first connection lines.

14. A photoelectric transducer device according to claim 1, wherein the material of said first and second lower electrodes comprises chromium.

15. A photoelectric transducer device according to claim 1, wherein the material of said upper electrode comprises aluminum.

16. A photoelectric transducer device according to claim 1, wherein the material of said second connection lines comprises aluminum.

17. A photoelectric transducer device according to claim 1, wherein said photoelectric conversion means comprises a α-Si.

18. A photoelectric transducer device, comprising:
    n sensor elements equally divided in N sensor blocks each containing k sensor elements, each sensor element including a first lower electrode, a photoelectric transducer element on said first electrode, a second lower electrode electrically separated from said first electrode, a diode element on said second electrode, and an upper electrode connection said photoelectric transducer element and said diode element, the first and second electrodes being formed of a material having a first resistivity;
    k connection lines, the k sensor elements in each sensor block corresponding to said k connection lines on a one-to-one basis, each connection being connected to the first electrodes of the sensor elements corresponding thereto, the connection lines being formed of a material having a second resistivity which is lower than the first resistivity; and
    means for dividing said n sensor elements to read image data from a document through said connection lines.

19. A photoelectric transducer device according to claim 18, wherein said driving means drives the k sensor elements in each sensor block concurrently.

20. A photoelectric transducer device according to claim 18, wherein said driving means drives the sensor blocks in sequence, block-by-block, such that the k sensor elements in each individual block are driven concurrently.

21. A photoelectric transducer device according to claim 18, wherein the material of said connection lines includes aluminum.

22. A photoelectric transducer device according to claim 18, wherein the material of said first and second lower electrodes includes chromium.

23. A photoelectric transducer device according to claim 18, wherein the material of said upper electrode includes aluminum.

24. A photoelectric transducer device according to claim 18, wherein, in each sensor block, the second lower electrodes of the k sensor elements are formed by a single common electrode.

25. A photoelectric transducer device according to claim 18, wherein, in each sensor element, said photoelectric transducer element is a photodiode and said diode element is a blocking diode connected with said photodiode anode-to-anode.

26. A photoelectric transducer device according to claim 18, wherein, in each sensor element, said photoelectric transducer element is a photodiode and said diode element is a blocking diode connected with said photodiode cathode-to-cathode.

27. A photoelectric transducer device according to claim 18, wherein a melting point of the material of said connection lines is lower than a melting point of the material of each of said first and second lower electrodes.

28. A photoelectric transducer device, comprising:
n sensor elements equally divided in N sensor blocks each containing k sensor elements, each sensor element including a first lower electrode, a photoelectric transducer element on said first electrode, a second lower electrode electrically separated from said first electrode, a diode element on said second electrode, and an upper electrode connection said photoelectric transducer element and said diode element, the first and second electrodes being formed of a material having a first resistivity;
k connection lines, the k sensor elements in each sensor block corresponding to said k connection lines on a one-to-one basis, each connection being connected to the first electrodes of the sensor elements corresponding thereto, the connection lines being formed of a material having a second resistivity which is lower than the first resistivity; and
means for driving said n sensor elements to read image data from a document, said means including a first shift register which controls an output of image data originating from the photoelectric transducer elements and a second shift register which controls the diode elements.

29. A photoelectric transducer device according to claim 28, wherein said driving means drives the k sensor elements in each block concurrently.

30. A photoelectric transducer device according to claim 28, wherein said driving means drives the sensor blocks in sequence, block-by-block, such that the k sensor elements in each individual block are driven concurrently.

31. A photoelectric transducer device according to claim 28, wherein the material of said connection lines includes aluminum.

32. A photoelectric transducer device according to claim 28, wherein the material of said first and second lower electrodes includes chromium.

33. A photoelectric transducer device according to claim 28, wherein the material of said upper electrode includes aluminum.

34. A photoelectric transducer device according to claim 28, wherein, in each sensor block, the second lower electrodes of the k sensor elements are formed by a single common electrode.

35. A photoelectric transducer device according to claim 28, wherein, in each sensor element, said photoelectrical transducer element is a photodiode and said diode element is a blocking diode connected with said photodiode anode-to-anode.

36. A photoelectric transducer device according to claim 28, wherein, in each sensor element, said photoelectric transducer element is a photodiode and said diode element is a blocking diode connected with said photodiode cathode-to-cathode.

* * * * *